United States Patent [19]

Yamazaki

[11] Patent Number: 4,609,930
[45] Date of Patent: Sep. 2, 1986

[54] THIN FILM TRANSISTOR

[75] Inventor: Tsuneo Yamazaki, Tokyo, Japan

[73] Assignee: Seiko Instruments & Electronics Ltd., Tokyo, Japan

[21] Appl. No.: 607,418

[22] Filed: May 7, 1984

[30] Foreign Application Priority Data

May 6, 1983 [JP] Japan ................ 58-78939

[51] Int. Cl.[4] ................ H01L 29/78
[52] U.S. Cl. ................ 357/23.7; 257/2; 257/4; 257/61
[58] Field of Search ........ 357/23.7, 2, 4, 61

[56] References Cited

U.S. PATENT DOCUMENTS 4,065,781 12/1977 Gutknecht ............ 357/4
4,119,992 10/1978 Ipri ............ 357/4
4,342,044 7/1982 Ovshinsky ............ 357/61 X

OTHER PUBLICATIONS

Hayama, Appl. Phys. Lett., 36(9) (May 1, 1980), pp. 754–755.
Fang, IBM Tech. Discl. Bull., vol. 20, No. 12 (May 1978), p. 5352.

Primary Examiner—Martin H. Edlow
Attorney, Agent, or Firm—Robert E. Burns; Emmanuel J. Lobato; Bruce L. Adams

[57] ABSTRACT

A thin film transistor of amorphous silicon is supported by an insulated gate on an insulating substrate and has the opposite side covered with a shading layer of amorphous silicon containing germanium in an amount more than 30% atomic density.

8 Claims, 6 Drawing Figures

THIN FILM TRANSISTOR

BACKGROUND OF THE INVENTION

The present invention relates to a thin film transistor having a shading layer which is easy to form and to a thin film transistor which is stable against external incident light.

Recently, the thin film transistor formed on the surface of an insulating substrate, such as glass, has been widely researched. A plurality of switching elements each made up of such a thin film transistor have been formed on insulating substrates in a matrix configuration to constitute a matrix liquid crystal display device, matrix electroluminescence display device or matrix electrochromic display device. These matrix display devices can be used for displaying a television image.

A semiconductor layer used for the thin film transistor consists of hydrogenated amorphous silicon. The hydrogenated amorphous silicon is considered to be a promising material. The hydrogenated amorphous silicon layer is formed by plasma chemical vapor deposition (hereinafter refered to as plasma CVD) on the surface of the substrate, such as a glass plate, at low cost. Since the hydrogenated amorphous silicon has a large photoconductivity (as is evident from its application for a solar cell,) the hydrogenated amorphous silicon must be used with shading in its application for a display device.

The sectional view of the thin film transistor with the conventional shading structure is shown in FIG. 1. As shown in FIG. 1, the thin film transistor consists of a glass substrate 1, a gate electrode 2 made of metal such as aluminum or chromium, a gate insulating layer 3 made of silicon dioxide, silicon nitride and so on, a hydrogenated amorphous silicon layer 4, source and drain electrodes 5, 6 each made of metal such as aluminum or chromium, insulating layers 7 and 8 each made of silicon dioxide, silicon nitride and so on and a shading layer 9 made of metal such as aluminum or chromium.

The thin film transistor shown in FIG. 1 operates as an insulated gate electric field effect type transistor by applying a voltage to the gate electrode 2. The application of the voltage causes a channel to be formed between the source electrode 5 and the drain electrode 6 and in the surface portion of the amorphous silicon layer 4 adjacent to the gate insulating layer 3.

Since the channel portion of the thin film transistor shown in FIG. 1 is covered by the shading layer 9 against incident light from the top direction and is also covered by the gate electrode 2 against incident light from the bottom direction, photo current is not induced in the channel between the source electrode 5 and the drain electrode 6. Therefore the thin film transistor normally operates under incident light conditions without a package. The thin film transistor shown in FIG. 1, however, has the following drawbacks.

1. Two additional photo etching processes are required for forming the insulating layer 8 and the shading layer 9 as compared to the ordinary process of fabrication of the thin film transistor.

2. The capacitive coupling between the amorphous silicon layer 4 and the shading layer 9 reduces the operating speed of the transistor.

3. The short circuit defect between the shading layer 9 and the source electrode 5 or drain electrode 6 reduces the yield rate of the transistor.

SUMMARY OF THE INVENTION

It is an object of the present invention to eliminate such drawbacks of the conventional thin film transistor. It is another object of the present invention to form the shading layer by means of a simple process. It is a further object of the present invention to provide an improved thin film transistor having a shading layer which does not adversely affect the operation of the transistor.

DETAILED DESCRIPTION OF THE INVENTION

Figure 1:
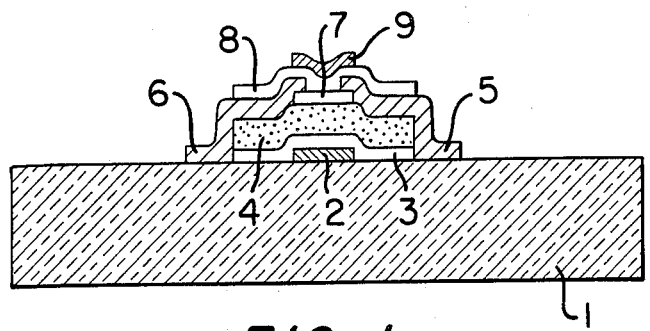
FIG. 1 shows a sectional view of a thin film transistor having the conventional shading layer.
Figure 2A:
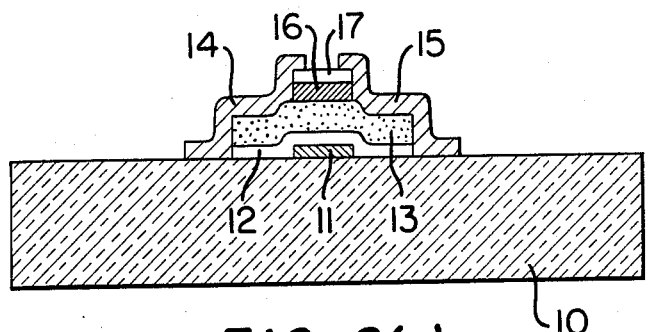
FIGS. 2(a), (b), (c) show sectional views of a thin film transistor having the shading layer according to the present invention.

Hereinafter the present invention is explained in detail with reference to preferred embodiments in conjunction with drawings. The sectional view of the thin film transistor having the shading layer according to the present invention is shown in FIG. 2(a). The thin film transistor according to the present invention comprises a glass substrate 10, a gate electrode 11 made of electrode material such as aluminum or chromium, a gate insulating layer 12 made of silicon dioxide, silicon nitride and so on, a hydrogenated amorphous silicon layer 13, source and drain electrodes 14, 15 each made of metal such as aluminum or chromium, a shading layer 16 made of amorphous germanium and an insulating layer 17 made of silicon dioxide, silicon nitride and so on. The shading layer 16 is formed on the channel portion of the hydrogenated amorphous silicon layer 13. The channel portion is located between the source electrode 14 and the drain electrode 15. The thin film transistor operates in the same manner as the conventional thin film transistor explained in FIG. 1.

Figure 3:
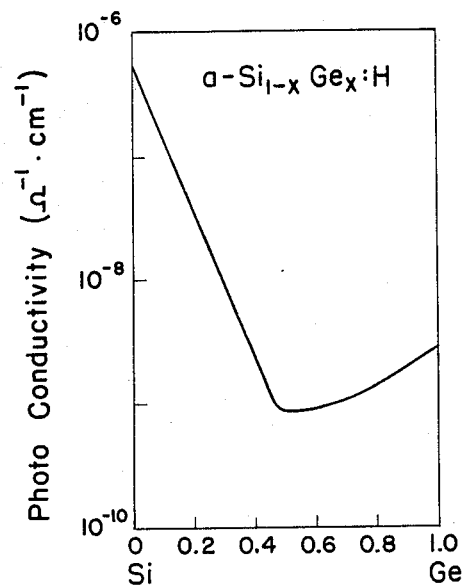
FIG. 3 shows the photoconductivity of the alloy of silicon and germanium.

The shading layer 17 is made up of an amorphous layer containing germanium. The amorphous layer made of an alloy of silicon and germanium is formed by the plasma CVD method. The amorphous layer so formed exhibits a photoconductivity characteristic as shown in FIG. 3 wherein the abscissa indicates the mole fraction of germanium relative to a mixture of germanium and silicon and the ordinate indicates the photoconductivity of the alloy of silicon and germanium. The alloy of silicon and germanium shows a minimum photoconductivity of $10^{-9}\,\Omega^{-1}\,cm^{-1}$ at a mole fraction of germanium 0.5. The amorphous germanium layer containing no silicon shows a considerably small photo conductivity of $10^{-9}\,\Omega^{-1}cm^{-1}$ order.

Figure 4:
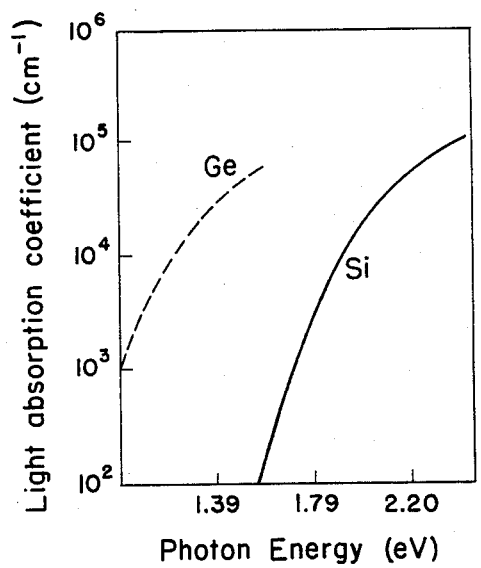
FIG. 4 shows the light absorption constant of the amorphous layers.

The light absorption constant of the amorphous germanium is shown in FIG. 4 wherein the abscissa indicates photon energy and the ordinate indicates the light absorption coefficient. The light absorption coefficient of the amorphous silicon is shown in the solid line while the light absorption coefficient of the amorphous germanium is shown in the dashed line. The amorphous germanium exhibits a greater light absorption coefficient than the amorphous silicon by an order of $10^2$ to $10^3$ over the entire spectrum range shown in FIG. 4. As understood from FIG. 3 and FIG. 4, the alloy of amorphous germanium has a large electric resistivity on the order of $10^9$ Ωcm under incident light. The alloy of amorphous germanium also has a large light absorption coefficient on the order of $10^4$ to $10^5$ cm$^{-1}$ over the range in which the amorphous silicon absorbs incident light. Therefore an amorphous germanium layer of a thickness of 0.1 to 2 μm functions as a substantially insulating layer with respect to the surface resistivity. It also serves as the shading layer against incident light. (The rectangular film of thickness 0.5 μm, length 10 μm and width 10 μm which is made of the amorphous germanium of photoconductivity $10^{-9}$ Ω$^{-1}$cm$^{-1}$ and light absorption coefficient $10^5$ cm$^{-1}$ has a sheet resistance of $10^{14}$ Ωcm and a light transmission rate of $5\times10^{-5}$.) Thus the amorphous layer containing germanium has a preferable characteristic for the shading layer of the thin film transistor made up of the amorphous silicon semiconductor layer.

The gate insulating layer 12, amorphous silicon layer 13, shading layer 16 and insulating layer 17 shown in FIG. 2(a) are formed as well known by the plasma CVD method or the sputtering method. These layers are therefore successively formed in a single common chamber. Since the pattern of the shading layer 16 is identical to the pattern of the insulating layer 17, an additional photo etching process is not required for forming the shading layer. Further, as shown in FIG. 2(a) since the insulating layer 17 is formed on the shading layer 16, the insulating layer well effectively insulates the shading layer 16 from other portions of the thin film transistor.

Figure 2B:
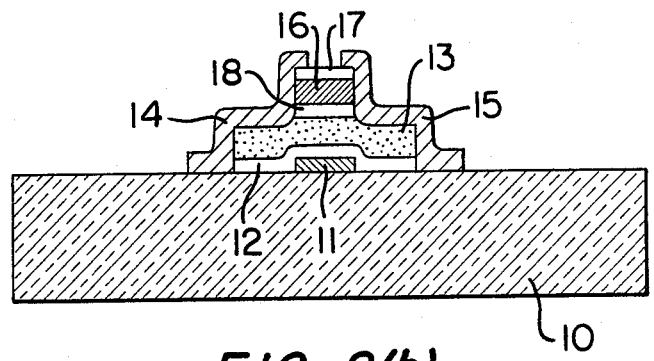

Another preferred embodiment of the thin film transistor having the shading layer is shown in the sectional view of FIG. 2(b). The same numeral denotes the same element in both FIG. 2(a) and FIG. 2(b). In this embodiment, another insulating layer 18 made of silicon nitride or silicon oxide is disposed between the amorphous silicon layer 13 and the shading layer 16. The amorphous silicon layer 13 and the shading layer 16 are wet-etched or dry-etched with substantially the same etching rate. The etching rate of the additional insulating layer 18 disposed between the amorphous silicon layer 13 and the shading layer 16 is different from those of the amorphous silicon layer 13 and the shading layer 16. Thus the shading layer 16 is selectively etched while leaving the amorphous silicon layer 13 unetched.

Figure 2C:
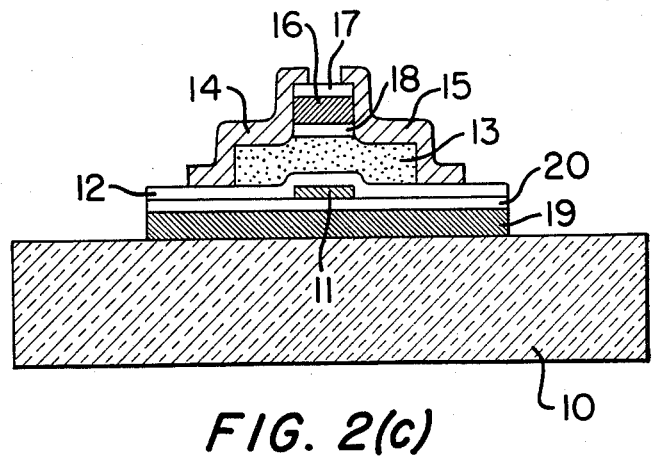

A further preferred embodiment of the thin film transistor having the shading layer is shown in the sectional view of FIG. 2(c). The same numeral denotes the same element in both FIG. 2(b) and FIG. 2(c). In this embodiment, another shading layer 19 containing amorphous germanium and another insulating layer 20 are provided on the glass substrate 10. A thin film transistor identical to the thin film transistor shown in FIG. 2(b) is provided on the additional shading layer 19. The thin film transistor is sandwiched by the shading layer 16 and the additional shading layer 19 so that the thin film transistor is completely sealed against incident light.

The thin film transistor having the above described shading layer according to the present invention has the following advantages and thus operates under incident light.

1. The transistor having the shading layer is easily fabricated according to the present invention.

2. The shading layer is an insulator so that the shading layer does not increase the parasitic capacitance of the transistor.

3. The shading layer is an insulator so that the shading layer does not cause a short circuit defect in the transistor.

In the foregoing description, the amorphous silicon is taken as an example of the semiconductor layer. It is understood that the present invention is generally applied for a thin film transistor comprised of a semiconductor layer having a band gap greater than that of the shading layer.

What I claim is:

1. A thin film transistor of an insulated gate electric field effect type comprising: a conductor layer of an electrically conductive material disposed on at least one major surface of a substrate to define a gate electrode; an insulator layer of an electrically insulating material disposed on the conductor layer; source and drain electrodes of electrically conductive material disposed on the substrate and in contact with edge portions of said insulator layer, said source and drain electrodes being spaced apart from each other; a semiconductor layer of semiconductor material in contact with said source and drain electrodes and in contact with said insulator layer in the region between said source and drain electrodes; a shading layer in contact with said source and drain electrodes and in contact with said semiconductor layer in the region between said source and drain electrodes, said shading layer comprised of an amorphous silicon containing germanium in an amount more than 30% by atomic density; and an insulator layer of an electrically insulating material in contact with said source and drain electrodes and in contact with said shading layer in the region between said source and drain electrodes.

2. A thin film transistor of an insulated gate electric field effect type as claimed in claim 1; further comprising another insulator layer of an electrically insulating material sandwiched between said shading layer and said semiconductor layer, said another insulator layer being in contact with said source and drain electrodes.

3. A thin film transistor of an insulated gate electric field effect type as claimed in claim 2; further comprising a multilayered structure comprised of an insulator layer and shading layer sandwiched between said substrate and first-mentioned insulator layer, the shading layer of the multilayered structure being composed of amorphous silicon containing germanium and being in contact with the one major surface of the substrate.

4. A thin film transistor of an insulated gate electric field effect type as claimed in claim 1; further comprising a multilayered structure comprised of an insulator layer and shading layer sandwiched between said substrate and first-mentioned insulator layer, the shading layer of the multilayered structure being composed of amorphous silicon containing germanium and being in contact with the one major surface of the substrate.

5. A thin film transistor of an insulated gate electric field effect type as claimed in claim 1; wherein the shading layer contains germanium in an amount from 40% to 80% by atomic density.

6. A thin film transistor of an insulated gate electric field effect type as claimed in claim 1; wherein the shading layer has a thickness in the range 0.1 to 2 μm.

7. A thin film transistor of an insulated gage electric field effect type as claimed in claim 1; wherein the shading layer has a thickness of about 0.1 μm.

8. A thin film transistor of an insulated gate electric field effect type as claimed in claim 1; wherein the shading layer has a thickness less than 2 μm.

* * * * *